United States Patent [19]
Keith

[11] Patent Number: 5,559,831
[45] Date of Patent: Sep. 24, 1996

[54] CIRCUITRY FOR DECODING HUFFMAN CODES

[75] Inventor: Michael Keith, Holland, Pa.

[73] Assignee: Intel Corporation, Santa Clara, Calif.

[21] Appl. No.: 546,619

[22] Filed: Oct. 23, 1995

Related U.S. Application Data

[63] Continuation of Ser. No. 279,260, Jul. 22, 1994, abandoned, which is a continuation of Ser. No. 173,714, Dec. 23, 1993, abandoned, which is a continuation of Ser. No. 812,418, Dec. 23, 1991, abandoned.

[51] Int. Cl.⁶ .............................. H04B 1/66; H03M 7/40; H03M 7/00
[52] U.S. Cl. ...................... 375/240; 341/67; 341/106
[58] Field of Search .................... 375/244, 245, 375/246, 253, 240, 241; 341/106, 65, 67, 51, 107; 348/384, 390, 403

[56] References Cited

U.S. PATENT DOCUMENTS

| | | | |
|---|---|---|---|
| 3,883,847 | 5/1975 | Frank | 340/146 |
| 4,386,416 | 5/1983 | Giltner et al. | |
| 4,700,175 | 10/1987 | Bledsoe | 341/65 |
| 4,899,149 | 2/1990 | Kahan | 341/67 |
| 5,045,853 | 9/1991 | Astle | |
| 5,068,723 | 11/1991 | Dixit et al. | 358/133 |
| 5,329,313 | 7/1994 | Keith | |

FOREIGN PATENT DOCUMENTS

| | | |
|---|---|---|
| 0145396 | 6/1985 | European Pat. Off. |
| 0286719 | 10/1988 | European Pat. Off. |
| WO89/05556 | 6/1989 | European Pat. Off. |

OTHER PUBLICATIONS

Information Theory Encoding, by Norman Abramson, McGraw–Hill Book Company, pp. 76–85.

*Primary Examiner*—Stephen Chin
*Assistant Examiner*—Hai H. Phan
*Attorney, Agent, or Firm*—William H. Murray; John V. Silverio

[57] ABSTRACT

A variable-length decoder system decodes a variable-length code having different code prefixes in an input bit stream. A code prefix is located in the bit stream and used to determine a number of bits to be selected from the input bit stream according to an access of a code book. Additionally, a pointer, directing access to a different code book, may also be indicated by the access of the first code book according to the located code prefix. A determination is made in this decoder system whether to perform the operation of determining a number of bits to be selected from the input stream or accessing a second code prefix table. If the code value is valid, the number of bits is selected and appended to the code prefix to form a code word which is later decoded by the system of the present invention. If another table is indicated a further code prefix is located in the input stream and the further lookup table is accessed in accordance with the further code prefix.

11 Claims, 2 Drawing Sheets

CIRCUITRY FOR DECODING HUFFMAN CODES

This application is a continuation of application Ser. No 08/279,260 filed on Jul. 22, 1994, now abandoned, which is a continuation of Ser. No. 08/173,714, filed on Dec. 23, 1993, now abandoned, which is a continuation of Ser. No. 07/812,418, filed on Dec. 23, 1991, now abandoned.

BACKGROUND OF THE INVENTION

1. Field of the Invention

This invention relates to the field of circuitry for decoding variable-length encoded data and in particular to circuitry for decoding variable-length encoded data having an unrestricted set of code words.

2. Background Art

Advances in the field of digital data processing have generated a demand for systems which can transfer, process, and store relatively large amounts of digital data. It is therefore often desirable that this digital data be compressed so that it may be more efficiently transmitted and so that it may be stored in a relatively small amount of memory.

An example of a digital data processing system requiring the transfer, processing, and storage of a relatively large volume of digital data is a video signal processing system. For example, a conventional video signal processing system may provide an image broken down into two hundred forty lines. Each line of the image may contain two hundred fifty six eight-bit independent pixel values. A video signal processing system of this type therefore requires 61,440 bytes for each image frame. Assuming an image display rate of thirty frames per second, this video processing system has a data rate of 1,843,200 bytes per second.

It is well known that the number of bytes per frame in a video signal processing system may be reduced by encoding in order to compress the video data. A prior art system of this type for encoding video data is described, for example, in U.S. Pat. No 4,125,861, entitled "Video Signal Encoding", which is incorporated by reference herein. In the video processing system described in this reference, the digital video data are first compressed using a differential pulse code modulation technique. The compressed data are then encoded using a variable-length code. In variable-length codes of this type the statistically more frequently occurring data values are assigned to the shorter code words and less frequently occurring data values are assigned to the longer code words. Thus fewer bits are required to encode the data. As used in this application, this type of encoding is referred to as statistical encoding.

One method known in the prior art for statistically encoding data in this manner is the use of an optimal variable-length code such as a Huffman code. To use a Huffman code, the data to be transmitted is put in order, from the most frequently occurring data values to the least frequently occurring ones. A Huffman code is then generated using, for example, the algorithm described at pages 77–85 of *Information Theory add Coding* by N. Abramson, McGraw Hill, 1963, which is incorporated by reference herein. Using this method, a code book which gives the correspondence between the data values and the code values is transmitted along with the encoded data. The transmitted code book permits the system which decodes the data to translate the code values into their corresponding data values. Because of the overhead of transmitting and storing the code book containing the encoded data this encoding technique is practical only when a relatively large amount of data is transmitted or stored.

It is well known in the art to use this statistical decoding method for codes of the form:

[11 . . . 10] [x(N) bits]

or

[00 . . . 01] [x(N) bits]

wherein N is the number of leading ones in the code prefix [11 . . . 10] or the number of leading zeros in the code prefix [00 . . . 01], and x(N) is a function of N specifying the number of bits forming the code value which follows the code prefix. In this method statistical decoding is performed by first scanning the input bits to be decoded and locating a code prefix. For example see U.S. Pat. No. 4,125,861. Then x(N) additional bits are fetched according to the length N of the located prefix. The fetched x(N) bits form a code value which serves as a unique index number. A unique index number indicates a data value which was previously encoded to represent one unique code in the code book. The code book may be specified by a small amount of memory containing the x(N) values.

Another known for statistically encoding data is processing the data according to a predetermined algorithm to obtain data having a statistical distribution of values which generally approximates a known distribution. The data are then encoded, using a code which has been adapted for the known distribution, transmitted, and then decoded using a fixed code book which is the inverse of the code book used to encode the data values.

U.S. Pat. No. 4,125,861 teaches a statistical system of this type wherein processing of data is performed to obtain a statistical distribution. Differential pulse code modulation processing is performed on input data by this system to produce data having a value distribution that has a peak at zero and falls off in a roughly exponential form on either side of the peak. These data are then statistically encoded using a preset code book stored in a read only memory. The data are then transmitted to a receiver which decodes the data using the inverse table, also stored in a read only memory.

A statistical system of the type taught in U.S. Pat. No. 4,125,861, has the advantage that it significantly compresses the input data and does not require transmission of a code book along with the compressed data. However, this type of statistical system has the disadvantage that the level of compression of the data obtained may not be as good as that which may be obtained if a more tailored statistical encoding scheme which is adapted to the data is used.

It would therefore be advantageous if a data encoding and decoding system could be provided that efficiently encoded data having a variety of statistical patterns but did not require restrictions on the permitted code book.

SUMMARY OF THE INVENTION

A variable-length decoder system decodes a variable-length code having different code prefixes in an input bit stream. A code prefix is located in the bit stream and used to determine a number of bits to be selected from the input bit stream according to an access of a code book. Additionally, a pointer, directing access to a different code book, may also be indicated by the access of the first code book according to the located code prefix.

DETAILED DESCRIPTION OF THE INVENTION

Figures 1, 2:
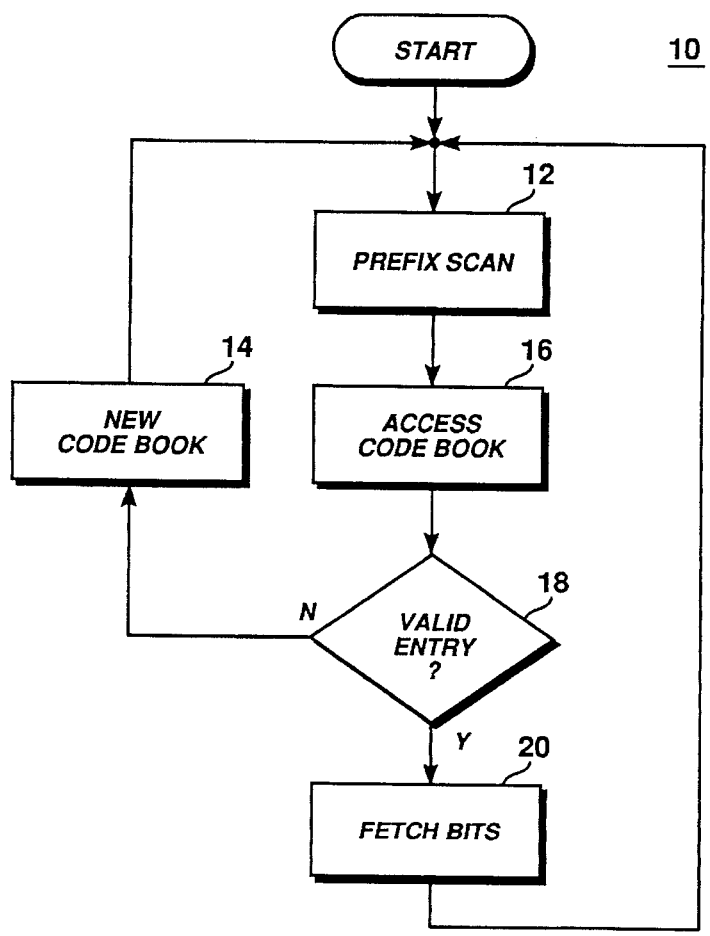
FIG. 1 shows a block diagram representation of the system for decoding Huffman codes of the present invention.
FIG. 2 shows a block diagram representation of recursive code books of the decoding system of FIG. 1.
Figures 3, 4:
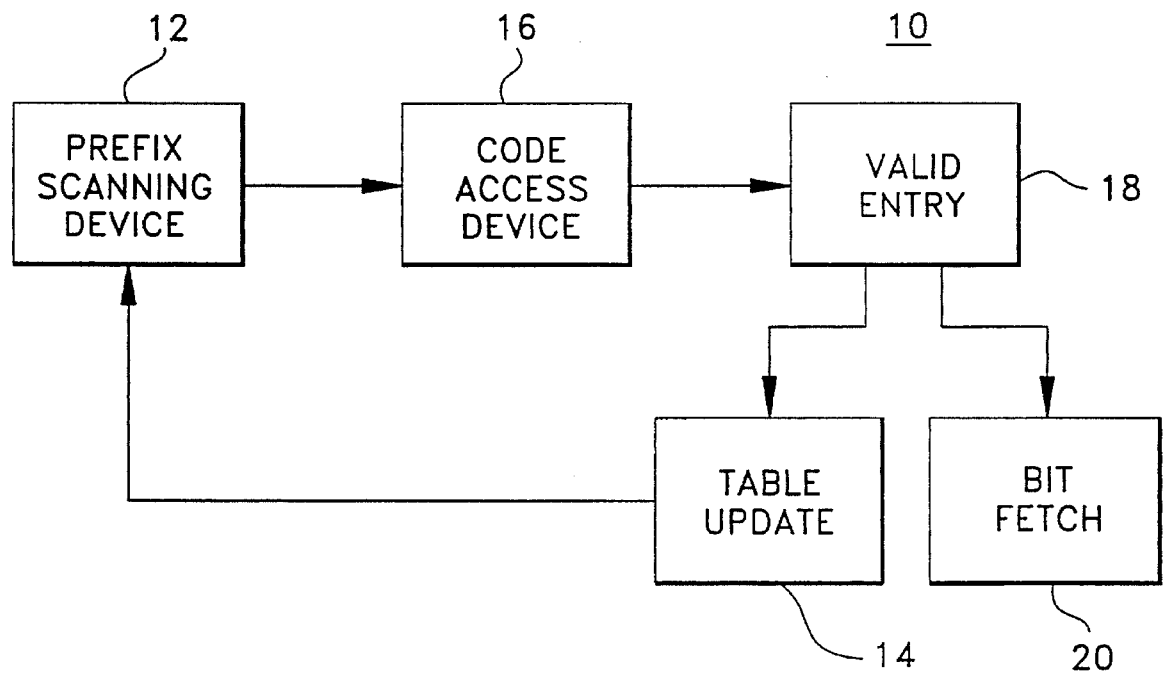
FIG. 3 shows a block diagram representation of the code books of FIG. 1.
FIG. 4 shows a block diagram representation of the system for decoding Huffman codes of the present invention.

Referring generally to the drawings, there are shown variable-length statistical decoder system 10 and recursive code books 30, 40 of the present invention. Variable-length statistical decoder system 10 is adapted to permit recursive access to code books 30, 40 during the decoding of a variable-length encoded input bit stream wherein the number of code books available for access is restricted only by the amount of memory space available for storing the code books. This type of recursive access to code books 30, 40 permits an unrestricted set of code words within statistical decoder system 10.

Variable-length statistical decoder system 10 begins by scanning the encoded input bit stream until a prefix including some number of one bits followed by a zero bit has been obtained. Statistical decoder system 10 use the located code prefix to access a row in a recursive code table x(N). An entry in the accessed row of the code book x(N) instructs statistical decoder system 10 to either (1) fetch x(N) additional bits of the variable-length encoded bit stream input, or (2) restart scanning the input bit stream for a second variable-length code prefix in order to access a row of a further recursive code book x'(N).

In the latter case, when a second variable-length code prefix is located, the accessed row of the further code book x'(N) is again used to specify either (1) a fetch of x'(N) additional bits from the input bit stream corresponding to the second code prefix, or (2) a further scan of the input bit stream to locate a third code prefix in order to access a third code book x"(N). When this third code prefix is found, statistical decoder system 10 makes a further determination whether to (1) fetch another x"(N) bits from the input bit stream or (2) to search for another code prefix for accessing a still further code book. This recursive statistical decoding process may continue for as many recursions as required.

Thus the input bit stream representing the data values which were encoded using a variable-length code are scanned and a code prefix is located as shown in prefix scan block 12 of variable-length statistical decoder system 10. When a code prefix is located in prefix scan block 12, a selected row of current recursive code book 30 is accessed according to the value of the code prefix as indicated in code book lookup block 16. Code book 30 contains the values x(N) which indicate the number of bits to be fetched from the input bit stream for various values of N. A determination is thus made by statistical decoder system 10 whether a valid value of x(N) is associated with the row of recursive code book 30 accessed by the located code prefix as shown in decision diamond 18.

For example, during execution of prefix scan block 12 statistical decoder system 10 may locate a code prefix indicated as binary value 11110 in the variable-length encoded input bit stream 30. Access to code book row 34 of recursive code book 30 is then made according to located code prefix 1111 during execution of lookup block 16 as shown in code prefix field 35 of row 34. Statistical decoder system 10 of the present invention returns a x(N) value of six from this lookup as shown in field 37 of row 34. Since N(4)=6 is a valid code, statistical decoder system 10 proceeds to code value fetch block 20 and fetches the next six bits of the variable-length encoded input bit stream and appends the fetched six bits as a code value to the located code prefix 1111. These six bits are later decoded within statistical decoder system 10.

However, if variable-length statistical decoder system 10 determines, in decision diamond 18, that the value x(N) of an accessed code book row of recursive code book 30 is not valid, statistical decoder system 10 does not fetch x(N) bits from the input stream. Instead, statistical decoder system 10 uses a code book pointer entry within the accessed row of recursive code book 30 to access a further recursive code book, such as recursive code book 40.

For example, if a code prefix indicated as binary value 1110 is located in prefix scanning block 12 of statistical decoder system 10, code book row 32 of recursive code book 30 is selected. The entry in field 36 of code book row 34 indicates to statistical decoder system 10 that a further recursive code book x'(N) is required as indicated by pointer arrow 38. Thus, statistical decoder system 10 uses recursive code book 40 or code book x'(N) for the next access as indicated in table update block 14.

After execution of table update block 14, a new code prefix is located within the encoded input bit stream as shown in prefix scan block 12. A code book row within recursive code book 40 is selected according to the newly located code prefix as shown in code book lookup block 16, and a determination is made in decision diamond 18 whether x'(N) for the selected N is valid. If it is valid execution of statistical decoder system 10 proceeds to code value fetch block 20 where the x'(N) value is used to select bits to be fetched from the encoded input bit stream.

It will be understood by those skilled in the art that the value of x'(N) selected in recursive code book 40 by statistical decoder system 10 may indicate that a further recursive code book x"(N) such as code book 50 should be selected rather than a fetch of x'(N) bits from the input bit stream. This determination is made by decision diamond 18. For example code book rows 42, 44 of recursive code book 40 indicate that further code books should be accessed rather than performing a fetch of the next x'(N) bits of the input bit stream. If it is determined that a further recursive code book is required, in accordance with decision diamond 18, execution again proceeds to code book update block 14 where the indicated further code book becomes the current code book.

It will be further understood by those skilled in the art that recursive code book 30 may be selected by recursive code book 40. For example the x'(N) entry of code book row 44 within recursive code book 40 indicates access to recursive code book 30. Additionally, it will be understood that the number of differing recursive code books which may be provided within variable-length statistical decoder system 10, for access by way of recursive code books 30, 40, is limited only by the size of the memory available to store the recursive code books.

Variable-length statistical decoder system 10 may thus be used to decode variable-length statistically encoded words of the form [11 ... 10] [11 ... 10] ... [11 ... 10] [x(N1, N2, ... Nk) bits]. A polarity bit may be used to instruct decoder 10 on the form for decoding the code words.

Furthermore, the complexity of the Huffman trees which can be decoded using statistical decoder system 10 is limited only by the amount of RAM provided.

While this inventions has been described with respect to specific, and particularly preferred, embodiments thereof, it is not limited thereto and the impended claims are intended to be construed to encompass not only the specific forms and variance of the invention shown but to such other forms and variance as may be devised by those skilled in the art without department from the true spirit and scope of this invention.

I claim:

1. A variable-length decoder system for decoding a variable-length code having a plurality of code values representing variable frequency of occurrence data values and a plurality of differing code prefixes in a variable-length encoded input bit stream, comprising:

means for determining a first code prefix of said plurality of differing code prefixes in said variable-length encoded input bit stream; and first code book means having means for determining whether to select a first number of selected bits to be fetched from said variable-length encoded input bit stream in accordance with said first code prefix or to select a second code book means, said second code book means having means for determining a second number of selected bits to be fetched from said variable-length encoded input bit stream in accordance with a second code prefix, wherein said second code prefix is determined from said plurality of differing code prefixes in a variable-length encoded input bit stream after the second code book is selected.

2. The variable-length decoder system of claim 1, further comprising means for fetching said first and second number of selected bits from said variable-length encoded input bit stream.

3. The variable-length decoder system of claim 2, wherein said first and second number of selected bits comprise a code value of said plurality of code values.

4. The variable-length decoder system of claim 1, further comprising means for selecting the second code prefix of said plurality of code prefixes in said variable-length encoded input bit stream.

5. The variable-length decoder system of claim 1, further comprising:

at least a third code book means, at least one of said at least first, second and third code book means having means for selecting at least one other of said at least first, second, or third code book means.

6. The variable-length decoder system of claim 5, wherein said at least a third code book means further comprises means for determining a third number of selected bits to be fetched from said variable-length encoded bit stream in accordance with a third code prefix.

7. A method for variable-length decoding of a variable-length code having a plurality of code values representing variable frequency of occurrence data values and a plurality of differing code prefixes in a variable-length encoded input bit stream, comprising the steps of:

(a) determining a first code prefix of said plurality of differing code prefixes in said variable-length encoded input bit stream; and (b) determining whether to select by a first code book means a first number of selected bits to be fetched from said variable-length encoded input bit stream in accordance with said first code prefix or (c) to select a second code book means, said second code book means having means for determining a second number of selected bits to be fetched from said variable-length encoded bit stream in accordance with a second code prefix, wherein said second code prefix is determined from said plurality of differing code prefixes in a variable-length encoded input bit stream after the second code book is selected.

8. The method for variable-length decoding of claim 7, further comprising the step of fetching said first or second number of selected bits from said variable-length encoded input bit stream.

9. The method for variable-length decoding of claim 8, wherein said first and second number of selected bits comprise a code value of said plurality of code values.

10. The method for variable-length decoding of claim 7, further comprising the further step of selecting the second code prefix of said plurality of code prefixes in said variable-length encoded input bit stream.

11. The method for variable-length decoding of claim 7, further comprising;

the step of determining whether to select at least a third code book means, said at least a third code book means having means for determining at least a third number of selected bits to be fetched from said variable-length encoded bit stream in accordance with a third code prefix.

\* \* \* \* \*